(12) United States Patent
Kim et al.

(10) Patent No.: US 10,319,132 B2
(45) Date of Patent: Jun. 11, 2019

(54) METHOD AND SYSTEM FOR REPRESENTING OBJECTS WITH VELOCITY-DEPENDENT PARTICLES

(71) Applicant: Nvidia Corporation, Santa Clara, CA (US)

(72) Inventors: Tae-Yong Kim, Seoul (KR); Nuttapong Chentanez, Bangkok (TH); Matthias Muller-Fischer, Zürich (CH)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 14/665,452

(22) Filed: Mar. 23, 2015

(65) Prior Publication Data

US 2015/0325028 A1  Nov. 12, 2015

Related U.S. Application Data

(60) Provisional application No. 61/990,483, filed on May 8, 2014.

(51) Int. Cl.
| | |
|---|---|
| *G06T 15/00* | (2011.01) |
| *G06T 13/20* | (2011.01) |
| *G06F 17/50* | (2006.01) |
| *G06T 7/20* | (2017.01) |

(52) U.S. Cl.
CPC .......... *G06T 13/20* (2013.01); *G06F 17/5009* (2013.01); *G06T 7/20* (2013.01); *G06T 2210/16* (2013.01); *G06T 2210/21* (2013.01); *G06T 2210/56* (2013.01)

(58) Field of Classification Search
CPC ......... G06T 19/00; G06T 17/20; G06T 17/00; G06T 15/10; G06T 15/00
USPC ....................................................... 345/419
See application file for complete search history.

(56) References Cited

U.S. PATENT DOCUMENTS

| | | | |
|---|---|---|---|
| 7,427,991 | B2 | 9/2008 | Bruderlin et al. |
| 7,813,903 | B2 | 10/2010 | Stam |
| 2005/0046629 | A1 | 3/2005 | Jeong et al. |
| 2006/0235659 | A1* | 10/2006 | Stam .................. G06F 17/5009 703/2 |
| 2011/0001950 | A1* | 1/2011 | DeVoe ................. G03F 7/2053 355/67 |

OTHER PUBLICATIONS

"Solid Simulation with Oriented Particles" (ACM Transactions on Graphics, vol. 30, No. 4, Article 92, Publication date: Jul. 2011. by Matthias Muller, and Nuttapong Chentanez).*
Muller, Matthias, et al., "Solid Simulation with Oriented Particles," NVIDIA PhysX Research, 2011, 9 pages.
Szeliski, Richard, et al., "Surface Modeling with Oriented Particle Systems," Computer Graphics 26, Jul. 2, 1992, pp. 185-194.
Witkin, Andrew, et al., "Using Particles to Sample and Control Implicit Surfaces," Department of Computer Science, Computer Graphics, Proc., SIGGRAPH 1994, 9 pages.

* cited by examiner

*Primary Examiner* — Gordon G Liu
(74) *Attorney, Agent, or Firm* — Kevin Brown; Parker Justiss, P.C.

(57) ABSTRACT

A method and system of representing and simulating an object by representing using with velocity-dependent particles.

14 Claims, 5 Drawing Sheets

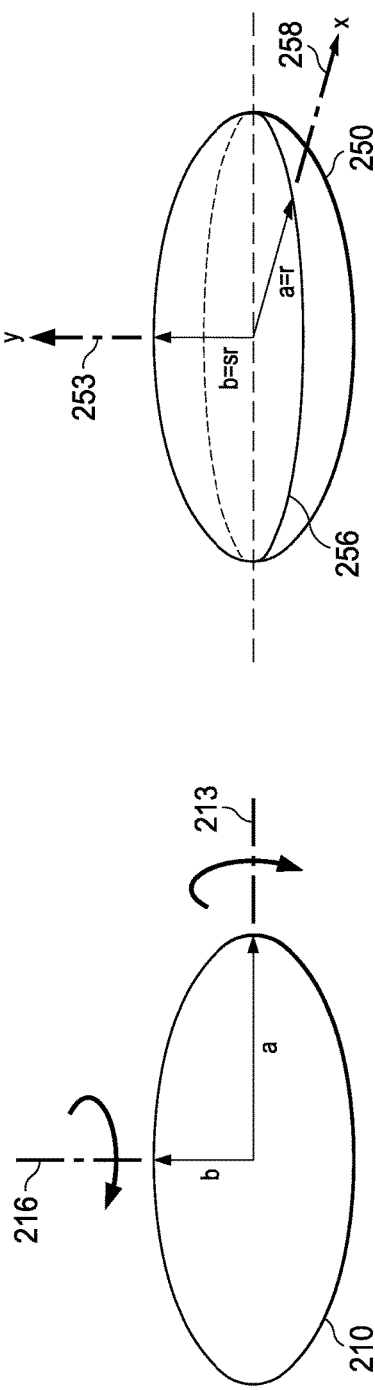
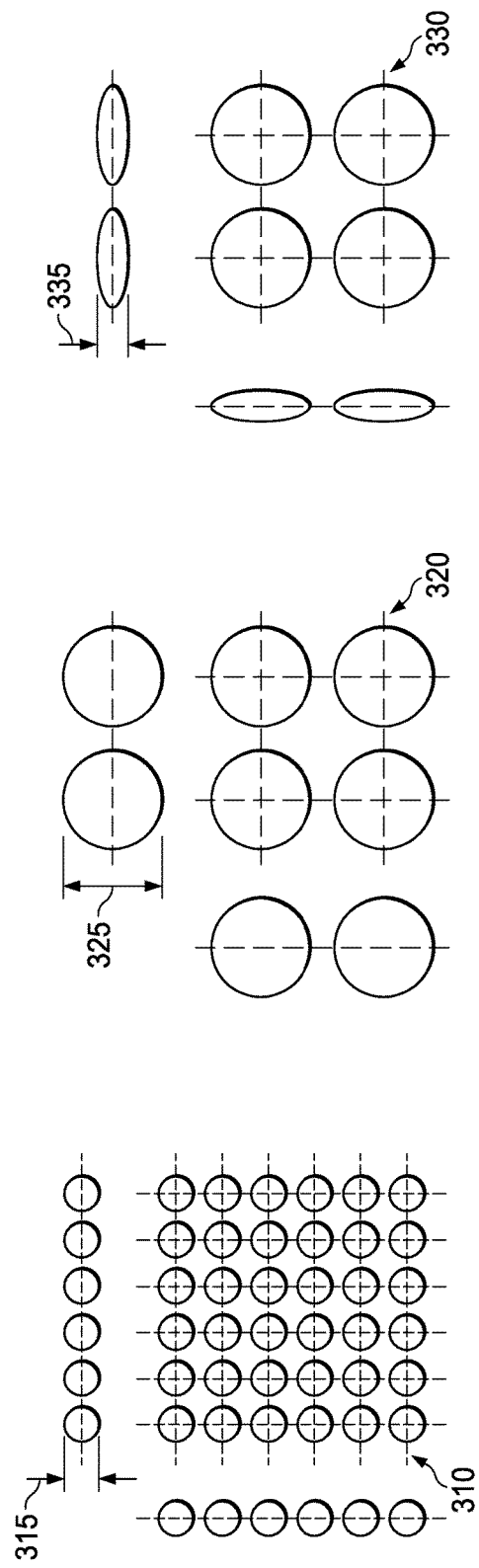

METHOD AND SYSTEM FOR REPRESENTING OBJECTS WITH VELOCITY-DEPENDENT PARTICLES

CROSS-REFERENCE TO PROVISIONAL APPLICATION

This application claims the benefit of U.S. Provisional Application No. 61/990,483 entitled "Method and System for Representing Objects with Velocity-Dependent Particles" to Tae-Yong Kim, et al., filed on May 8, 2014 which is commonly assigned with the present invention and incorporated herein by reference as if reproduced herein in its entirety.

TECHNICAL FIELD

This application is directed, in general, to the computer simulation of physical structures and, more specifically, to systems and method for representing and simulating graphics objects with particles of velocity-dependent shape and size.

BACKGROUND

It is often important to simulate physical objects using computer models to analyze or demonstrate their behavior. One common application for such computer models is gaming, in which objects of various types are made to interact with one another in a simulated, three-dimensional universe that acts in predictable ways according to physical laws. A common occurrence in games is the collision of an object with another object (i.e. an inter-collisions), or with parts of itself (i.e. a self-collisions). In collisions involving impenetrable objects, it is important that no object penetrate or pass through another.

With the increasing visual sophistication of games, faithful rendition of thin objects, such as clothing or thin sheets of matter, has become important. Such thin objects will be referred to herein as "cloth." Multi-layered clothing worn by a game character, for example, can involve a complex set of inter-collisions and self-collisions. Faithful simulation of thin objects, called "cloth simulation," requires not only that pieces of the objects do not pass through each other, but also that their collisions convey a visual experience consistent with their thinness. The same considerations apply to surfaces of three-dimensional objects, if the perception of their sharpness is important in a specific context.

In one method, objects are represented with particles taking the form of spheres of positive volume, each centered on a point in a grid. Each particle has a position and a velocity. At any time step in the simulation, if a point representing another object or a piece of the same object enters the sphere representing a point on the object, a collision has occurred. Adjustments are then made to the positions of the particles involved to ensure that they do not pass through each other. In "Solid Simulation with Oriented Particles," ACM Transactions on Graphics (SIGGRAPH 2011), 30(4), pp 92:1-92:10, Müller et al. employed particles that carry orientation and rotation, in addition to position and velocity. Such particles improve shape-matching and mesh skinning. In addition, they may be implemented using anisotropic objects, which can approximate surfaces more closely than spheres. Müller et al. teach the use of ellipsoids as oriented particles.

SUMMARY

One aspect provides a method of representing an object using velocity-dependent particles. Another aspect provides a simulator operable to simulate an object by representing said object using velocity-dependent particles. Yet another aspect provides a video display system operable to display an object simulated by representing said object using velocity-dependent particles.

BRIEF DESCRIPTION

Reference is now made to the following descriptions taken in conjunction with the accompanying drawings, in which:

FIGS. 2A and 2B are diagrams of an ellipse and an oblate spheroid, respectively;

FIGS. 3A-3C are diagrams illustrating spatial coverage efficiency and collision thickness for representations of a thin object with small spheres, large spheres, and oblate spheroids, respectively;

DETAILED DESCRIPTION

Figure 1:
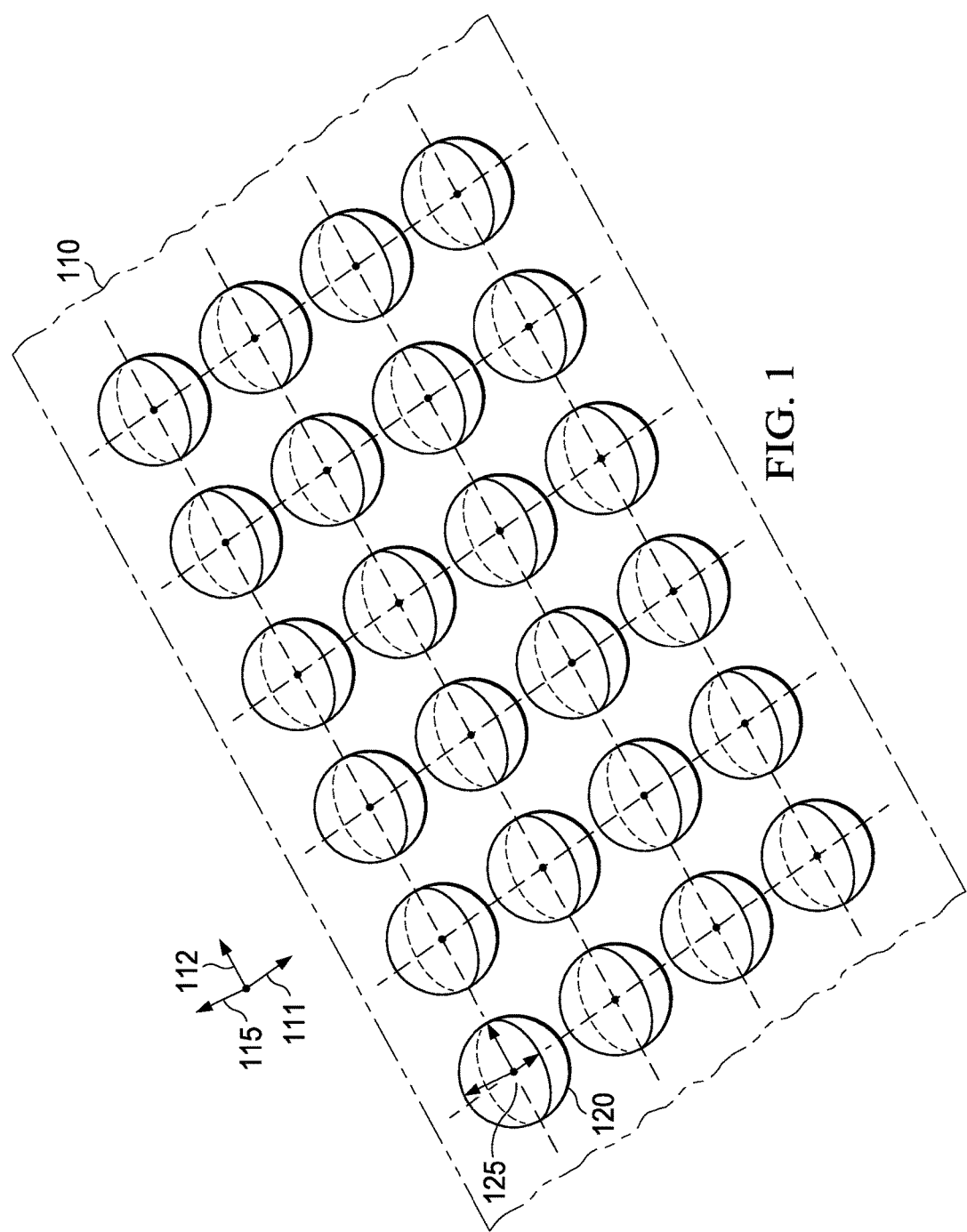
FIG. 1 is a diagram illustrating representation of a surface by spherical particles.

It is realized herein that self-collisions and inter-collisions may be simulated more effectively by using particles that depend upon time-varying properties of the objects involved. More specifically, it is realized herein that advantages in simulation of collisions arise if particle geometry is made dependent upon the relative velocities of two colliding objects. Various embodiments of systems and methods will now be described that take advantage of one or more of these realizations. In detecting collision between two spheroids, faster moving particles are more likely to incur collision misses if they completely pass each other in a single time step. Larger sphere radius in general reduces such issues, however these result in increased thickness and overlaps between such spheres for nearby particles. In a packed configuration, such as shown in FIG. 1, the oblate spheroids can only grow or shrink along the direction of surface normal, where a changing radius would not introduce the aforementioned overlap problems. It is realized that collision behaviors between fast moving particles are obscure by nature. This observation may be employed to adapt the sphere radius along normal direction based on the velocity of particles. When particles do not move, these radii can be set to pre-defined minimum and collisions are still not incurred. When particles move fast, the radii can be increased to improve the effectiveness of collision detection.

FIG. 1 illustrates representation of a thin object by spherical particles. A piece of the thin object 110 is shown, together with a normal direction 115 normal to the surface of the object and two in-place directions 111 and 112. The object 110 is represented by identical spheres such as a sphere 120, all of the same size and centered on points on a grid such as a grid-point 125. If the spheres are relatively small, the visual experience of inter-collisions and self-collisions reflects a thin surface, since the object reacts to collisions only at close range. However, since spheres have the same radius in the surface normal direction 115 than in the in-plane directions 111 and 112, a large number of small spheres are needed to cover the surface with sufficient spatial resolution, degrading computational efficiency. In addition, there is a risk that a fast approaching object may pass through the surface within a single simulation time step. Decreasing the time step alleviates this problem, but it too degrades computational efficiency. Covering the surface with a smaller number of larger spheres on a sparse grid is highly desirable from an efficiency standpoint, and there is a smaller risk of pass-through in a single time step, but the visual experience of collisions undesirably reflects a thicker surface as the object recoils from objects farther away.

In an embodiment of this invention, the shape and size of a particle used to represent a point on a thin object depend on the relative velocity between said particle and a nearby particle on the same object or on another object. In an embodiment, the size of the particles normal to the object is decoupled from their size along the surface of the object to avoid having to adjust the grid in time, and to allow greater spatial coverage efficiency. An oblate spheroid is an embodiment of such a particle.

A spheroid, sometimes called a spheroid of revolution, is a three-dimensional shape resulting from the revolution of an ellipse about one of its principal axes. FIGS. 2A and 2B illustrate an ellipse and an oblate spheroid, respectively. A prolate spheroid (not shown) results from a 360-degree rotation of an ellipse 210 about a major axis 213. By contrast, an oblate spheroid 250 results from a 360-degree rotation of the ellipse 210 about a minor axis 216. The oblate spheroid 250 is symmetric around a semi-minor axis 253 with length b, which is normal to an equatorial circle 256. The length b is also called the polar radius. In an arbitrary direction in the plane of the equatorial circle 256 is a semi-major axis 258 with length a. The semi-minor and semi-major axes 253 and 258 are often called the principal axes of the oblate spheroid 250. The length a of the semi-major axis 258 is equal to the equatorial radius:

$$a = r,$$

while $$b = sr,$$

where $0 < s \leq 1$ is the aspect ratio of the oblate spheroid 250. If x and y are radial and polar coordinates, respectively, a point (x,y) lies on the surface of the spheroid 210 if and only if $$\frac{x^2}{r^2} + \frac{y^2}{s^2 r^2} = 1.$$

Equivalently, a point x lies on the surface of the spheroid 210 if and only if it satisfies the constraint equation:

$$c(x) = x^T A x - 1 = 0,$$

where $$A = \begin{bmatrix} \frac{1}{r^2} & 0 \\ 0 & \frac{1}{s^2 r^2} \end{bmatrix}.$$

Finally, the gradient of the constraint c(x) is normal to the surface of the spheroid:

$$\nabla c = 2Ax = 2 \begin{bmatrix} \frac{x}{r^2} \\ \frac{y}{s^2 r^2} \end{bmatrix}$$

FIGS. 3A-3C illustrate spatial coverage efficiency and collision region thickness for representations of a thin object with small spheres, large spheres, and oblate spheroids, respectively. In FIG. 3A, representation with small spheres results in a relatively inefficient dense grid 310, but the small particle width normal to the surface of the object provides for a thin collision region 315 covering from both the front and back of the object. In FIG. 3B, representation with large sphere has enabled a sparse grid 320, improving the spatial coverage efficiency. However, the collision width 325 is also larger and the collision behavior of the object reflects this larger thickness. In FIG. 3C, representation with oblate spheroids provides both a sparse grid 330 and a thin collision region 335.

Figure 4:
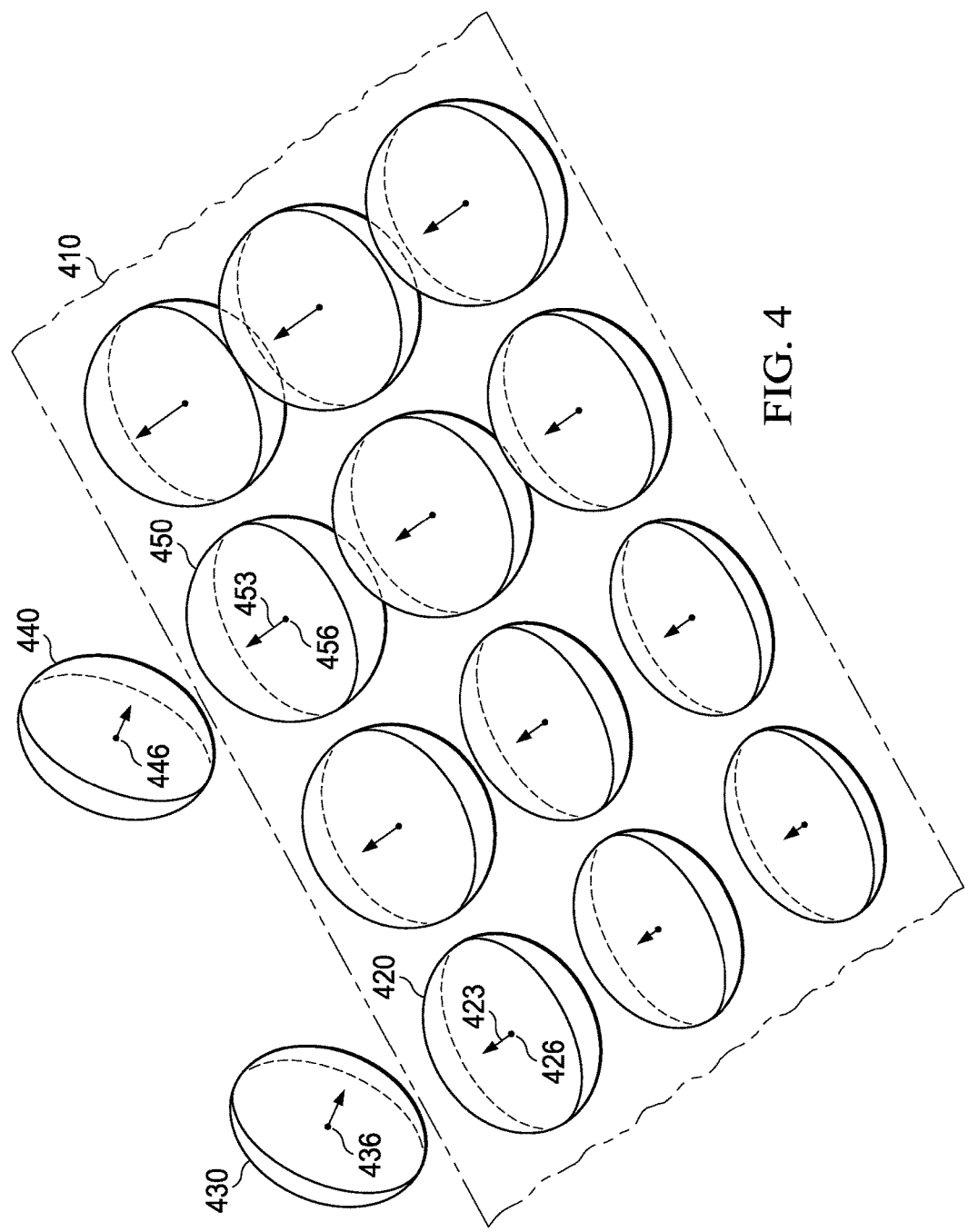
FIG. 4 is a diagram of one embodiment of representation of a thin object by oblate spheroid particles with varying polar radii.

FIG. 4 illustrates an embodied representation of a thin object by oblate spheroid particles with varying polar radii. A piece of a thin object 410 is shown, represented by oblate spheroids oriented such that their polar axes are locally normal to the surface of the object and their equatorial circles are on the local plane of the object surface. Representation by oblate spheroids decouples the size of the particle in the normal direction from those in the in-plane directions, rendering it more practical for the former to change dynamically. An oblate spheroid 420 with polar radius 423 is centered at point 426 on the object 410. An oblate spheroid 430 centered at point 436 has been identified as a candidate for collision with oblate spheroid 420. The oblate spheroid 430 may represent another object or another piece of the object 410. In one embodiment, the oblate spheroid 430 has been identified as a collision candidate using hash table techniques known in the art. Likewise, an oblate spheroid 440 centered at point 446 has been identified as a candidate for collision with oblate spheroid 450, which is centered at point 456 on the object and has a polar radius 453. In an embodiment, if the relative velocity between points 426 and 436 is relatively lower than the relative velocity between points 446 and 456, the polar radius 423 of the oblate spheroid 420 is set relatively smaller than the polar radius 453 of the oblate spheroid 450. More generally, where relative velocities to collision candidates are lower, particles representing the object 410 have relatively smaller polar radii. In such regions, there is little risk of pass-through within a simulation time step and the relatively thinner particles ensure collision behavior reflecting the thinness of the object. Where relative velocity is larger and collision may be more imminent, particles have relatively larger polar radii. The risk of pass-through is averted, allowing a relatively larger simulation time step, and the speed of any collision alleviates any perception of thickness. As objects move with time, different points may become collision candidates and relative velocities may change. The polar radii of the particles are adjusted accordingly. This embodiment simultaneously provides for high spatial coverage and time-step efficiency, as well as good thinness perception and good robustness against pass-through.

In certain embodiments, where any orientation of the particles within the plane of the thin object is unnecessary, oblate spheroids are particularly advantageous over ellipsoids. Oblate spheroids increase efficiency not only because there is no need to store in-plane orientation, but also because the two-dimensional mathematics of spheroids is substantially simpler than the three-dimensional mathematics of ellipsoids. Illustrated embodiments are also compatible with efficient hash table methods for collision detection. Furthermore, they can be efficiently implemented in parallel algorithms on CPUs or GPUs.

Figure 5:
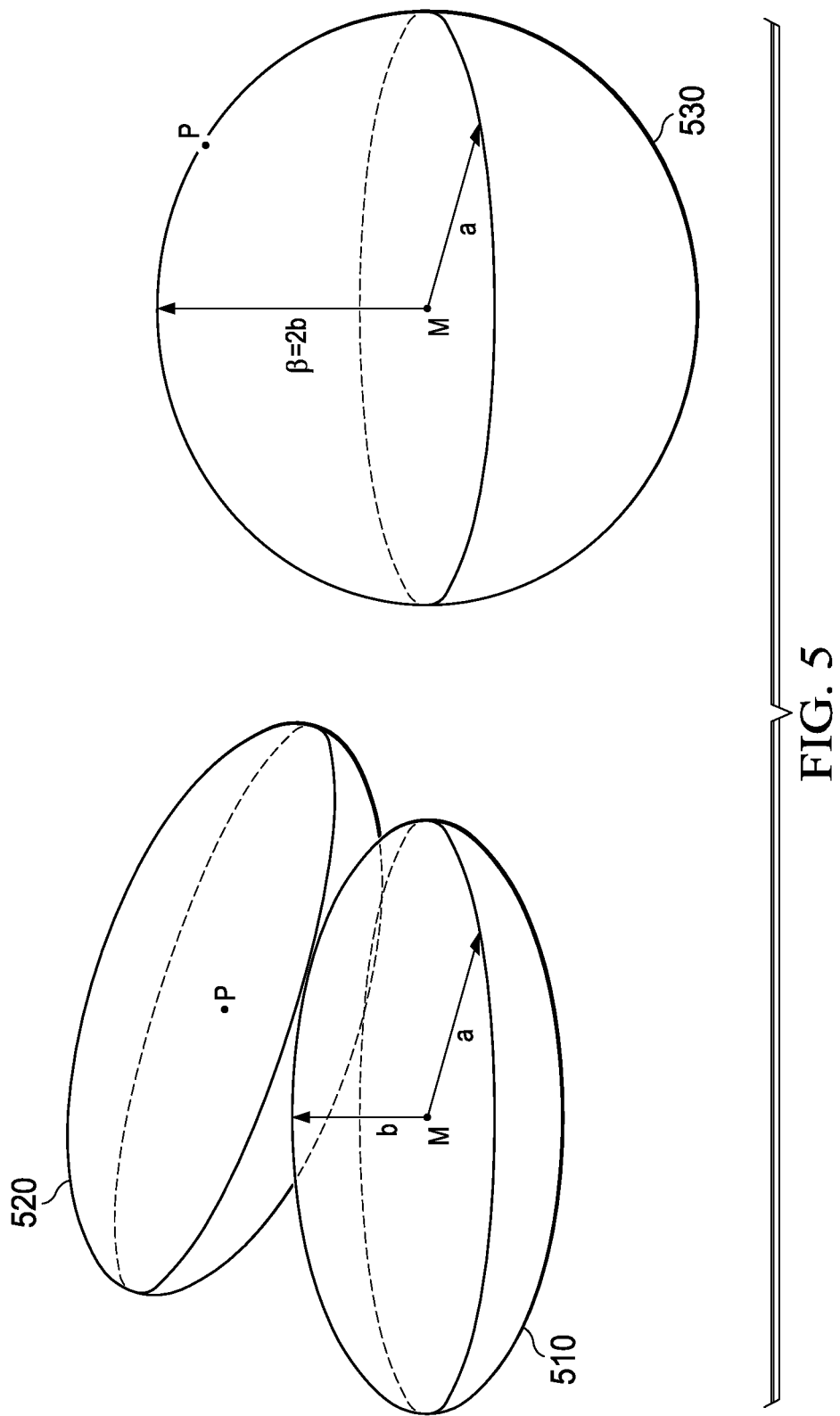
FIG. 5 is a diagram illustrating a collision between oblate spheroid particles.

FIG. 5 illustrates an embodied method for detecting collisions between two oblate spheroid particles. In this embodiment, an oblate spheroid 510 is centered at a point M located on an object and an oblate spheroid 520, centered at a point P, is examined for collision. The oblate spheroid 520 may be on another object in a potential inter-collision or on the same object in a potential self-collision. In this embodiment, as an approximation, a collision between the two oblate spheroids 510 and 520 is considered to have occurred if the center point P of the oblate spheroid 520 collides with a stretched spheroid 530, centered at M. In an embodiment, the length β of the semi-minor axis of the stretched spheroid 530 is twice as long as the length b of the minor axis of the oblate spheroid 510, while the equatorial radius a is the same for both spheroids 510 and 530.

Figure 6:
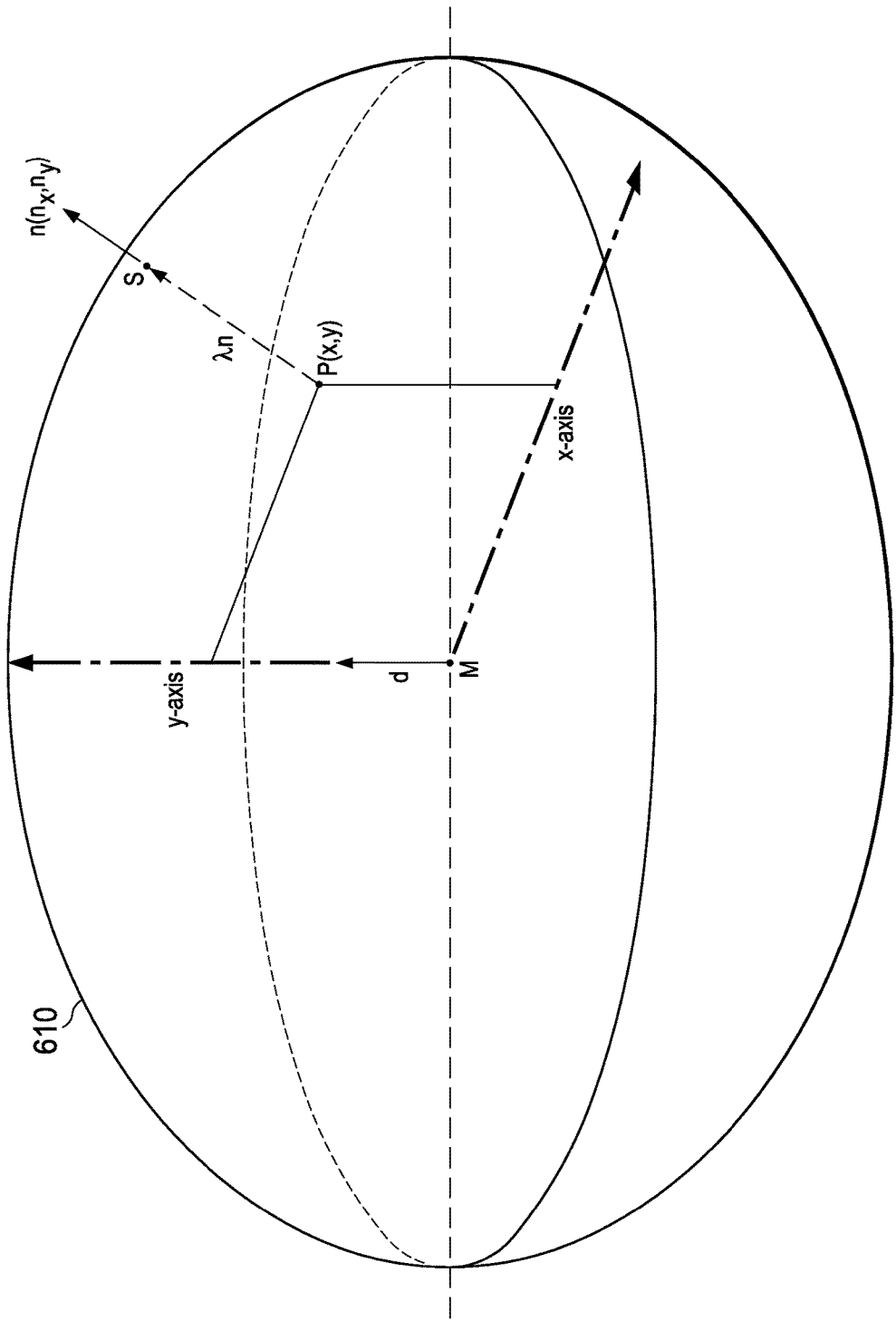
FIG. 6 is diagram illustrating a collisions between a point and a spheroid particle.

FIG. 6 illustrates an embodied method for detecting collisions between a point and a spheroid. A point P has collided with a spheroid 610 if it lies on the surface of or inside the spheroid 610. For clarity, the point P is shown inside the spheroid 610. The x- and y-coordinates of P are given by $$y = P \cdot d$$

and $$x = \|P - yd\|,$$

where d is the unit vector along the semi-minor axis.

The closest distance between the point P and the surface of the spheroid 610 occurs along a vector n normal to the surface. The point on the surface closest to P is the point S, which may be written as $$S = P + \lambda n = \begin{bmatrix} x + \lambda n_x \\ y + \lambda n_y \end{bmatrix},$$

where λ is a scalar. P is inside the spheroid, on its surface, or outside it if λ is positive, zero, or negative, respectively. S is on the surface of the spheroid if c(S)=0, or equivalently, if $$(s^2 n_x^2 + n_y^2)\lambda^2 + (2s^2 x n_x + 2y n_y)\lambda + s^2 x^2 + y^2 - r^2 = 0,$$

where $n_x$ and $n_y$ are evaluated at S and are therefore functions of λ. In an embodiment, the equation above is reduced to a quadratic in λ by approximating n by the gradient of the constraint c(x) at P, giving $$n_x = \frac{2x}{r^2} \text{ and } n_y = \frac{2y}{s^2 r^2}.$$

Whether a collision has occurred or not is determined by solving the equation above for λ and determining its sign.

Those skilled in the art to which this application relates will appreciate that other and further additions, deletions, substitutions and modifications may be made to the described embodiments. Particles may depend on relative velocities in a variety of manners. For example, the size of particles normal to a thin object may be a linear or non-linear function of one or more relative velocities or components thereof, or be limited by specific upper or lower bounds. Objects other than oblate spheroids may be used and different methods and approximations may be employed to calculate collisions between them and other objects, planes, or points. Embodiments may involve representation and simulation of thin objects such as cloth or metal sheets, or surfaces of three-dimensional objects.

What is claimed is:

1. A method of determining a collision of cloth in a game simulation, comprising:
    representing said cloth using oblate spheroids; and
    treating intersections involving said oblate spheroids as collisions, wherein a size of said oblate spheroids only in a dimension normal to a surface of said cloth is dependent on a velocity of the oblate spheroids.

2. The method as recited in claim 1, wherein principal axes of said oblate spheroids are normal to a surface of said object proximate said oblate spheroids.

3. The method as recited in claim 1, wherein said dimensions depend upon relative velocities of said oblate spheroids and other particles.

4. The method as recited in claim 3 wherein said other particles are other oblate spheroids of said object.

5. The method as recited in claim 1, wherein a collision between said oblate spheroid and a particle is approximated by a collision between a center of said particle and an enlarged version of said oblate spheroid.

6. A game simulator operable to simulate cloth by representing said cloth using velocity-dependent particles wherein said simulator:
    represents said cloth using oblate spheroids; and
    treats intersections involving said oblate spheroids as collisions, wherein a size of said oblate spheroids only in a dimension normal to a surface of said cloth is dependent on a velocity of the oblate spheroids.

7. The simulator as recited in claim 6, wherein principal axes of said oblate spheroids are normal to a surface of said object proximate said oblate spheroids.

8. The simulator as recited in claim 6, wherein said dimensions depend upon relative velocities of said oblate spheroids and other particles.

9. The simulator as recited in claim 8 wherein said other particles are other oblate spheroids of said object.

10. The simulator as recited in claim 6, wherein a collision between oblate spheroid and a particle is approximated by a collision between a center of said particle and an enlarged version of said oblate spheroid.

11. A video display system operable to display cloth simulated, wherein said cloth is simulated by:
    representing said cloth using oblate spheroids; and
    treating intersections involving said oblate spheroids as collisions, wherein a size of said oblate spheroids only in a dimension normal to a surface of said cloth is dependent on a velocity of the oblate spheroids.

12. The video display system as recited in claim 11, wherein a principal axis of a said oblate spheroid is locally normal to a surface of said object.

13. The video display system as recited in claim 11, wherein a size of a said oblate spheroid is an increasing function of the relative velocity of said oblate spheroid and another particle.

14. The video display system as recited in claim 13 wherein another particle is another oblate spheroid of said object.

* * * * *